United States Patent
Morita et al.

(10) Patent No.: US 10,033,164 B2
(45) Date of Patent: Jul. 24, 2018

(54) POWER LINE COMMUNICATION APPARATUS

(71) Applicant: PANASONIC INTELLECTUAL PROPERTY MANAGEMENT CO., LTD., Osaka-shi, Osaka (JP)

(72) Inventors: Tomohiro Morita, Fukuoka (JP); Yoshimi Tokunaga, Kumamoto (JP); Yoshinori Kaneko, Saga (JP); Shuichi Kuriyama, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 43 days.

(21) Appl. No.: 15/186,941

(22) Filed: Jun. 20, 2016

(65) Prior Publication Data

US 2016/0294165 A1  Oct. 6, 2016

Related U.S. Application Data (63) Continuation of application No. 13/854,384, filed on Apr. 1, 2013, now Pat. No. 9,386,732, which is a
(Continued)

(51) Int. Cl.
*H02B 1/20* (2006.01)
*H02B 1/56* (2006.01)
(Continued)

(52) U.S. Cl.
CPC ............... *H02B 1/20* (2013.01); *H02B 1/46* (2013.01); *H02B 1/56* (2013.01); *H04B 3/54* (2013.01);
(Continued)

(58) Field of Classification Search
CPC ... H02B 1/20; H02B 1/56; H02B 1/46; H05K 7/2039; H05K 9/00; H04B 3/54; H04B 2203/5454; H04B 2203/5445
See application file for complete search history.

(56) References Cited

U.S. PATENT DOCUMENTS 3,536,960 A * 10/1970 Otteson .................. F22B 27/14
257/718
3,956,675 A * 5/1976 Bauer ................ H05K 7/20418
174/548
(Continued)

FOREIGN PATENT DOCUMENTS

JP         2003-218831         7/2003

*Primary Examiner* — David M Sinclair
*Assistant Examiner* — Theron S Milliser
(74) *Attorney, Agent, or Firm* — Greenblum & Bernstein, P.L.C.

(57) ABSTRACT

A power line communication apparatus includes a power plug configured to connect to a power line, and a power plug receiver configured to connect to the power plug. The power line communication apparatus also includes a power line communicator configured to receive a signal transmitted through the power line, and a power supplier configured to generate power based on power received from the power plug and supply the generated power to the power line communication apparatus. The power line communication apparatus further includes a power board on which the power plug receiver is mounted, and a heat radiator that connects to the power line communicator and radiates heat generated from the power line communicator, wherein a portion of the heat radiator overlaps a portion of the power board when viewed perpendicular to the power board, and the portion of the power board does not include the power plug receiver.

20 Claims, 9 Drawing Sheets

Related U.S. Application Data continuation of application No. 12/182,200, filed on Jul. 30, 2008, now Pat. No. 8,411,451.

(51) Int. Cl.
| | | |
|---|---|---|
| *H02B 1/46* | (2006.01) | |
| *H05K 9/00* | (2006.01) | |
| *H05K 7/20* | (2006.01) | |
| *H04B 3/54* | (2006.01) | |

(52) U.S. Cl.
CPC ............ *H05K 7/2039* (2013.01); *H05K 9/00* (2013.01); *H04B 2203/5445* (2013.01); *H04B 2203/5454* (2013.01)

(56) References Cited

U.S. PATENT DOCUMENTS

| | | | |
|---|---|---|---|
| 4,858,071 A | 8/1989 | Manabe et al. | |
| 5,018,050 A * | 5/1991 | Maenishi | H05K 5/0247 335/202 |
| 5,051,866 A | 9/1991 | Osaka | |
| 5,052,481 A * | 10/1991 | Horvath | H01L 23/4006 165/185 |
| 5,243,510 A * | 9/1993 | Cheney, II | H01R 13/6675 363/126 |
| 5,281,152 A | 1/1994 | Takahashi et al. | |
| 5,359,493 A * | 10/1994 | Chiu | H01L 23/4006 257/719 |
| 5,598,322 A * | 1/1997 | Von Arx | H02B 1/052 361/704 |
| 5,706,177 A | 1/1998 | Nather et al. | |
| 5,744,934 A * | 4/1998 | Wu | H01R 13/6675 307/150 |
| 5,842,514 A * | 12/1998 | Zapach | H01L 23/427 165/104.33 |
| 5,956,231 A * | 9/1999 | Yamada | H01L 23/049 257/678 |
| 6,018,455 A * | 1/2000 | Wilkie, II | H02B 1/21 165/80.3 |
| 6,049,043 A | 4/2000 | Tonejc | |
| 6,061,243 A | 5/2000 | Barnett et al. | |
| 6,091,611 A * | 7/2000 | Lanni | H01R 13/6675 307/151 |
| 6,172,884 B1 * | 1/2001 | Lanni | H01R 13/6675 363/21.05 |
| 6,250,939 B1 * | 6/2001 | Chou | H01R 13/6658 439/172 |
| 6,278,607 B1 | 8/2001 | Moore et al. | |
| 6,282,092 B1 * | 8/2001 | Okamoto | H01L 23/142 165/80.3 |
| 6,402,546 B1 * | 6/2002 | Groves | H01R 13/72 439/172 |
| 6,532,157 B1 * | 3/2003 | Glenn | H01L 31/0203 174/255 |
| 6,563,710 B1 * | 5/2003 | Okuda | H05K 7/20918 361/600 |
| 6,639,806 B1 | 10/2003 | Chuang et al. | |
| 6,644,984 B2 * | 11/2003 | Vista, Jr. | H01R 12/58 439/76.1 |
| 6,655,591 B1 | 12/2003 | Feng | |
| 6,672,878 B2 | 1/2004 | Dean | |
| 6,845,013 B2 * | 1/2005 | Hartke | H05K 1/141 165/185 |
| 6,956,464 B2 | 10/2005 | Wang et al. | |
| 6,972,688 B2 | 12/2005 | Rapaich | |
| 7,023,324 B2 | 4/2006 | Kodama et al. | |
| 7,048,451 B2 * | 5/2006 | Lo | G02B 6/4201 385/89 |
| 7,081,009 B2 | 7/2006 | Gorman | |
| 7,212,420 B2 * | 5/2007 | Liao | H01R 13/6675 363/146 |
| 7,408,780 B2 | 8/2008 | Karidis et al. | |
| 7,905,729 B2 | 3/2011 | Goosens et al. | |
| 7,978,489 B1 * | 7/2011 | Telefus | H01R 13/24 363/142 |
| 8,050,037 B2 * | 11/2011 | Tsuyuno | H05K 1/141 165/104.33 |
| 9,024,581 B2 * | 5/2015 | McGinley | H01R 31/065 320/111 |
| 2002/0172916 A1 * | 11/2002 | Cao | A61C 19/004 433/29 |
| 2002/0181217 A1 | 12/2002 | Patriche | |
| 2003/0002297 A1 * | 1/2003 | Nemtsev | A61N 5/0616 362/571 |
| 2003/0191796 A1 | 10/2003 | Hershenson et al. | |
| 2003/0219693 A1 * | 11/2003 | Cao | A61C 19/004 433/29 |
| 2004/0121281 A1 * | 6/2004 | Fischer | A61C 19/004 433/29 |
| 2005/0057898 A1 | 3/2005 | El-Batal et al. | |
| 2005/0250449 A1 | 11/2005 | Janik et al. | |
| 2006/0165047 A1 | 7/2006 | Kodama et al. | |
| 2006/0203897 A1 | 9/2006 | Kodama et al. | |
| 2007/0019669 A1 | 1/2007 | Binder | |
| 2007/0072486 A1 * | 3/2007 | Gorman | H01H 11/0006 439/535 |
| 2007/0087722 A1 | 4/2007 | Ichihara | |
| 2007/0120953 A1 | 5/2007 | Koga et al. | |
| 2007/0149258 A1 | 6/2007 | Tokunaga | |
| 2007/0206345 A1 | 9/2007 | Kodama et al. | |
| 2008/0123302 A1 | 5/2008 | Kawano et al. | |
| 2008/0304255 A1 * | 12/2008 | Cauchois | F21S 9/02 362/183 |
| 2009/0060061 A1 | 3/2009 | Konishi et al. | |
| 2011/0106996 A1 * | 5/2011 | Rosso | G06F 13/409 710/300 |

* cited by examiner

POWER LINE COMMUNICATION APPARATUS

CROSS REFERENCE TO RELATED APPLICATIONS

This application is a continuation of U.S. patent application Ser. No. 13/854,384 filed Apr. 1, 2013 which is a continuation of U.S. patent application Ser. No. 12/182,200, filed Jul. 30, 2008, now U.S. Pat. No. 8,411,451 issued Apr. 2, 2013, the content of which are expressly incorporated herein by reference in their entireties.

BACKGROUND

Technical Field

The present invention relates to a power line communication apparatus capable of performing communication employing a power line as a transmission medium.

Background Art

Recently, there has been suggested a power line communication system capable of transmitting data by superposing a high-frequency signal on a power line carrying electric power such as commercial power. As such a type of a power line communication system, there is known a multi-carrier transmission communication apparatus capable of transmitting and receiving a multi-carrier communication signal (for example, see JP-A-2003-218831).

The power line communication apparatus such as a PLC (Power Line Communication) modem used in the power line communication system can be realized into various types such as an AC adapter type directly connected to an outlet of a power line, a single modem type having a function of a hub, a router, or the like, and an apparatus-integrated type integrated into a PC (Personal Computer) or the like. Accordingly, if a signal processor of the PLC modem is designed in accordance with a type of respective apparatus, design cost or manufacture cost may be increased that much.

An analog signal processor of the PLC modem has a problem in that when the analog signal processor is apart from a coupler which separates and couples a high frequency signal for the power line communication from and with the power line, noise may increase in the analog high frequency signal (communication signal of the power line), thereby deteriorating a communication performance. Meanwhile, it is preferable that the analog signal processor of the PLC modem and a network interface unit such as Ethernet (registered trademark) provided in the subsequent step of the PLC modem are apart from each other as much as possible.

For that reason, various units such as a power supply unit, a signal processor, and an interface unit are necessary to be arranged in consideration of various circumstances of the power line communication apparatus.

SUMMARY

According to an aspect of the invention, there is provided a communication apparatus which performs communication through a power line and a transmission medium different from the power line. The communication apparatus includes: a power board which is provided with a power unit connected to the power line; an interface board which is separately formed from the power board and is provided with an interface for performing communication through the transmission medium; and a communication board which is separately formed from the power board and the interface board and is provided with a power line communication unit for performing communication through the power line and a connection unit electrically connectable to the power board and the interface board.

According to the invention, there is provided a communication apparatus capable of configuring a communication board provided with a signal processor for power line communication which can be in common even in various types of an apparatus.

BRIEF DESCRIPTION OF THE DRAWINGS

The above advantage of the present invention will become more apparent by describing in detail preferred exemplary embodiments thereof with reference to the accompanying drawings, wherein like reference numerals designate like or corresponding parts throughout the several views, and wherein.

DETAILED DESCRIPTION

Figure 1:
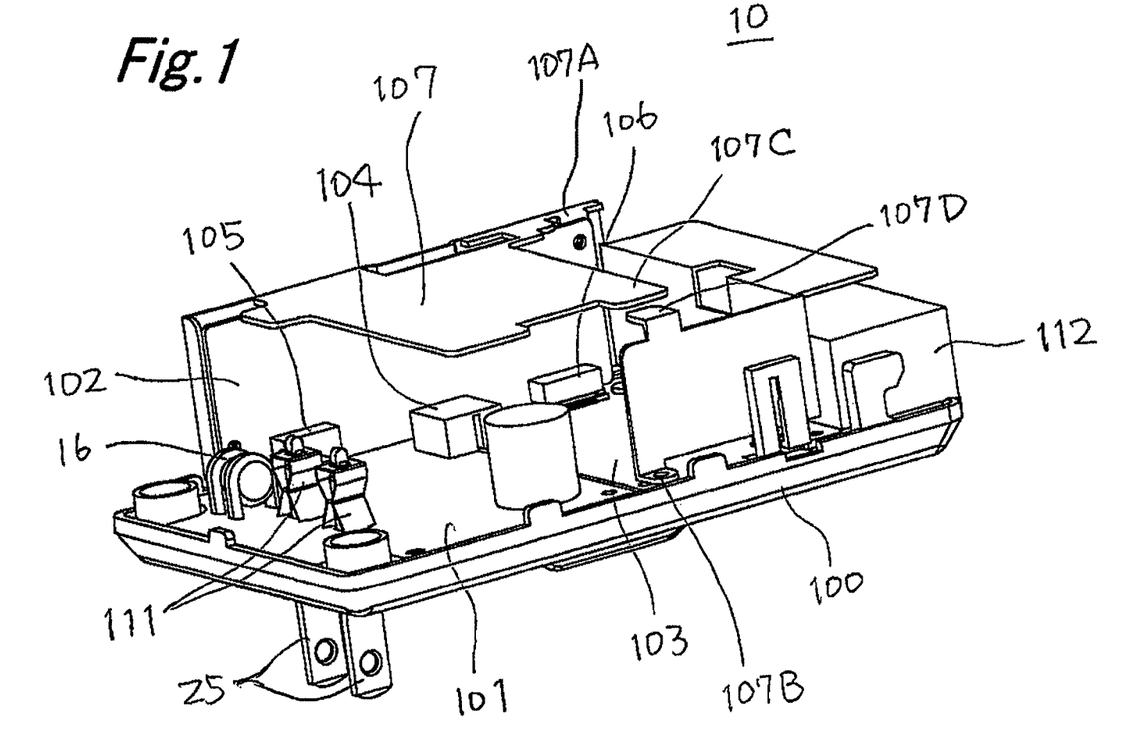
FIG. 1 is a perspective view illustrating an arrangement configuration of major elements of a communication apparatus.

FIG. 1 shows a configuration example of an AC adapter-typed PLC modem directly connected to an outlet of a power line. The configuration of the communication apparatus is not limited thereto, but may be modified in various forms.

In a PLC modem 10, a power plug 25 is integrally formed on one outer surface of a lower casing 100 so as to protrude therefrom. The PLC modem 10 is of an AC adapter-type which is directly connected to an outlet of the power line. A power board 101 on which a power unit is formed, a communication board 102 on which a signal processor for power line communication is formed, and an interface board 103 on which a network interface unit of an Ethernet (registered trademark) are housed within the lower casing 100.

Three boards are arranged in such a manner that the power board 101 and the interface board 103 are connected through a power connector 104 to be arranged on one plane and that the communication board 102, which is separately formed from the power board 101 and the interface board 103, is erected to the power board 101 and the interface board 103 at a substantially right angle. In addition, the communication board 102 is electrically connected to the power board 101 and the interface board 103 through a first connector (PLC connector) 105 and a second connector (interface connector) 106, respectively.

The communication board 102 is fixed to a board holding frame 107A of a heat radiator 107 formed by curving a plate-shaped member such as a metal plate or the like using a screw or the like, and is connected to the power board 101 and the interface board 103 through the first connector 105 and the second connector 106, respectively. In addition, the heat radiator 107 is attached and fixed to the lower casing 100 along with the interface board 103 by a screw or the like in a fixing portion 107B in a state where the heat radiator 107 holds and fixes the communication board 102 to be integrally formed with the power board 101 and the interface board 103.

Figure 2:
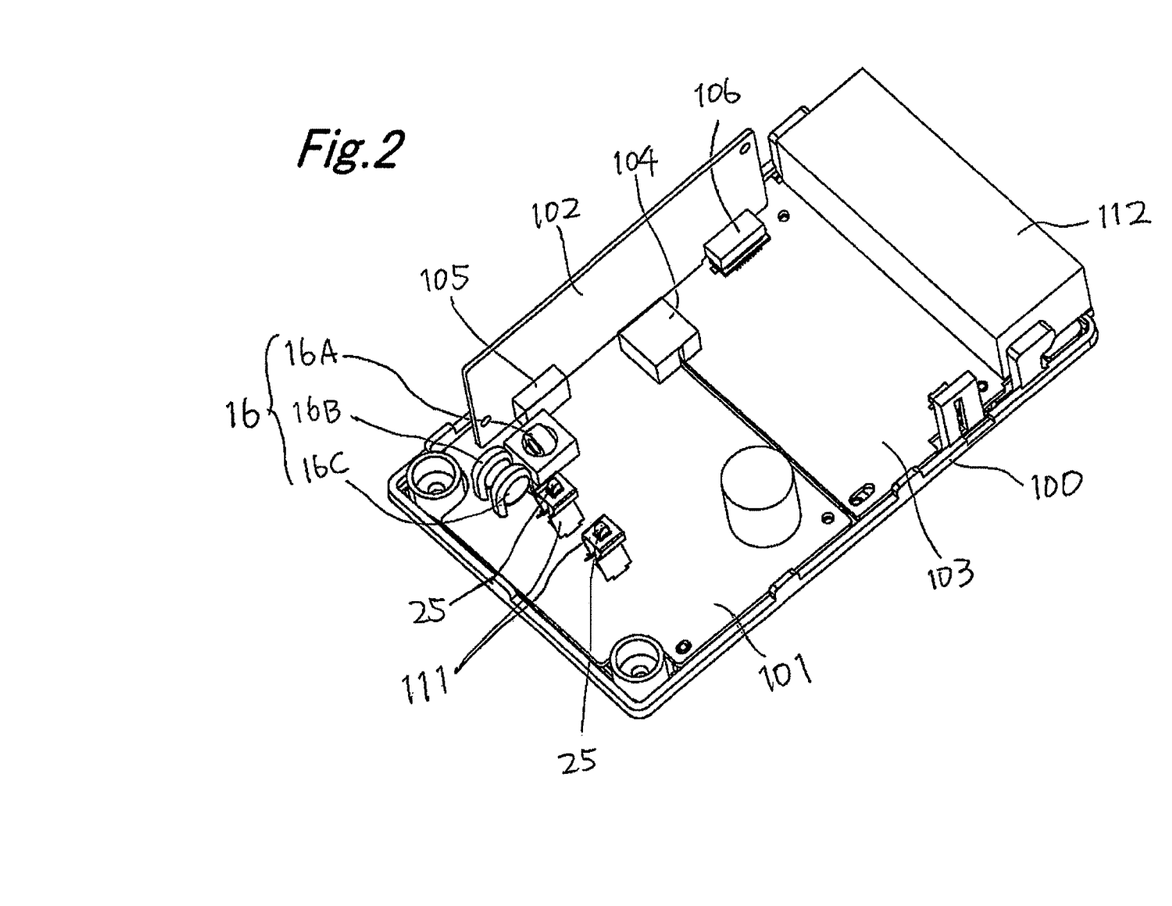
FIG. 2 is a perspective view illustrating a configuration of each board of the communication apparatus.

In FIG. 2, the heat radiator 107 is omitted and the power board 101, the communication board 102, and the interface board 103 are shown for convenient explanation.

On the power board 101, a plug receiver 111 of a power plug 25, a coil transformer 16A and coupling capacitors 16B and 16C of the coupler 16, one part of the power connector 104, one part of the first connector 105, and the like are mounted as major components. On the interface board 103, the other part of the power connector 104, one part of the second connector 106, a network connection unit 112 housing four modular jacks for network connection, and the like are mounted as major components. On the communication board 102, the other part of the first connector 105, the other part of the second connector 106, a circuit IC (not shown), and the like are mounted as major components. At this time, the first connector 105 and the second connector 106 are positioned at both ends in a longitudinal direction of the communication board 102 to be apart from each other. The first connector 105 which serves as a PLC connector includes a connection portion of a transmission path through which a high frequency analog signal (PLC signal) for PLC is transmitted. The second connector 106 which serves as an interface connector includes a connection portion of a transmission path through which a digital signal containing data, which is transmitted to and received from another apparatus through a network interface or the like.

Figure 3A:
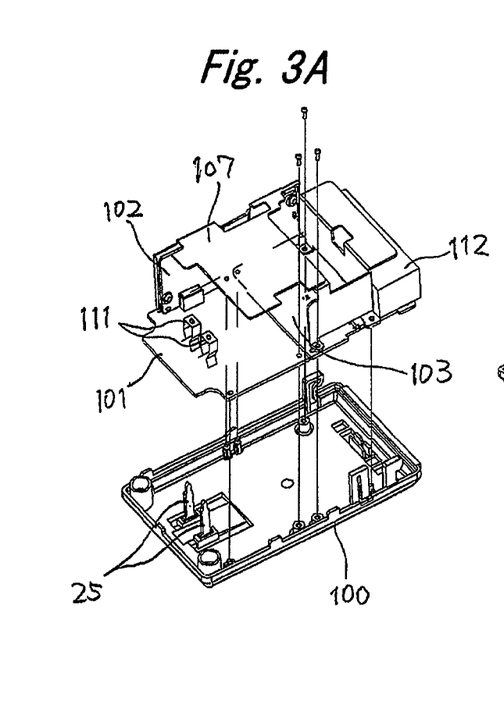
FIG. 3A is perspective view illustrating the assembly process of each unit of the communication apparatus.

As shown in FIG. 3A, the power board 101, the interface board 103, the communication board 102, and the heat radiator 107 are integrally assembled to be connected to each other. At this time, a base end of the power plug 25 is inserted into the plug receiver 111 of the power board 101, and the power board 101, the interface board 103, and the heat radiator 107 are fixed to the lower casing 100 using a screw. Boss formed at predetermined positions of the lower casing 100 engage with boss holes of the power board 101 and the interface board 103, so that the boards are positioned on the lower casing 100.

Figure 3B:
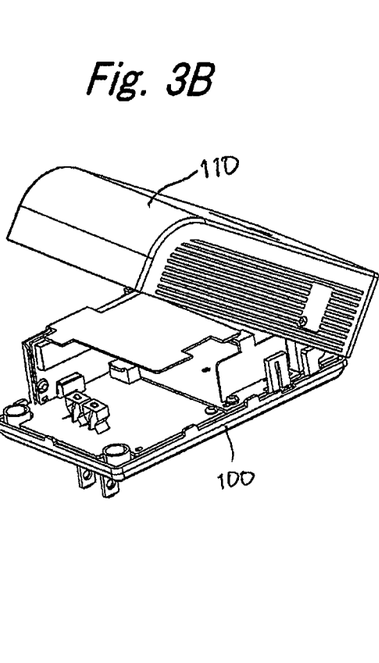
FIG. 3B is a perspective view illustrating the assembly of the upper casing.
Figure 3C:
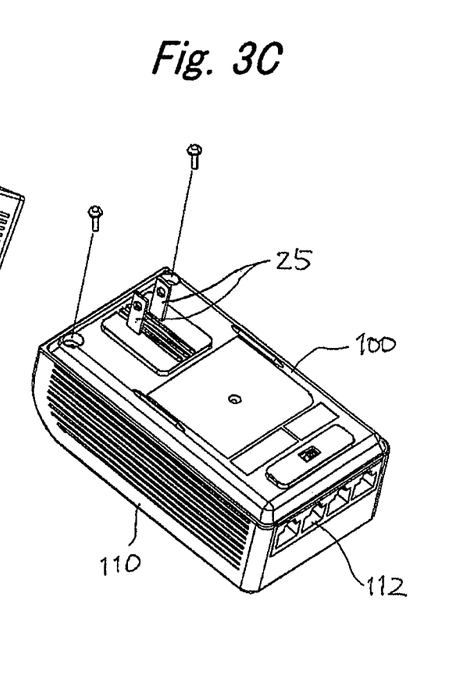
FIG. 3C is a perspective view illustrating the assembly of the upper casing and the lower casing.

Subsequently, as shown in FIG. 3B, the boards positioned on the lower casing 100 are covered with an upper casing 110. As shown in FIG. 3C, the lower casing 100 and the upper casing 110 are fixed to each other by screws. In the PLC modem 10 assembled in this way, the power plug 15 and the network connection unit 112 are exposed outside. In addition, the power plug 25 is configured so as to be connected to an outlet of a power line and the network connection unit 112 is configured so as to be connected to a network cable. Electric power is supplied through the power line and the PLC signal is received and transmitted, so that the PLC modem 10 enables data communication to be performed by transmitting data to another apparatus such as a PC through the network cable.

Figure 4:
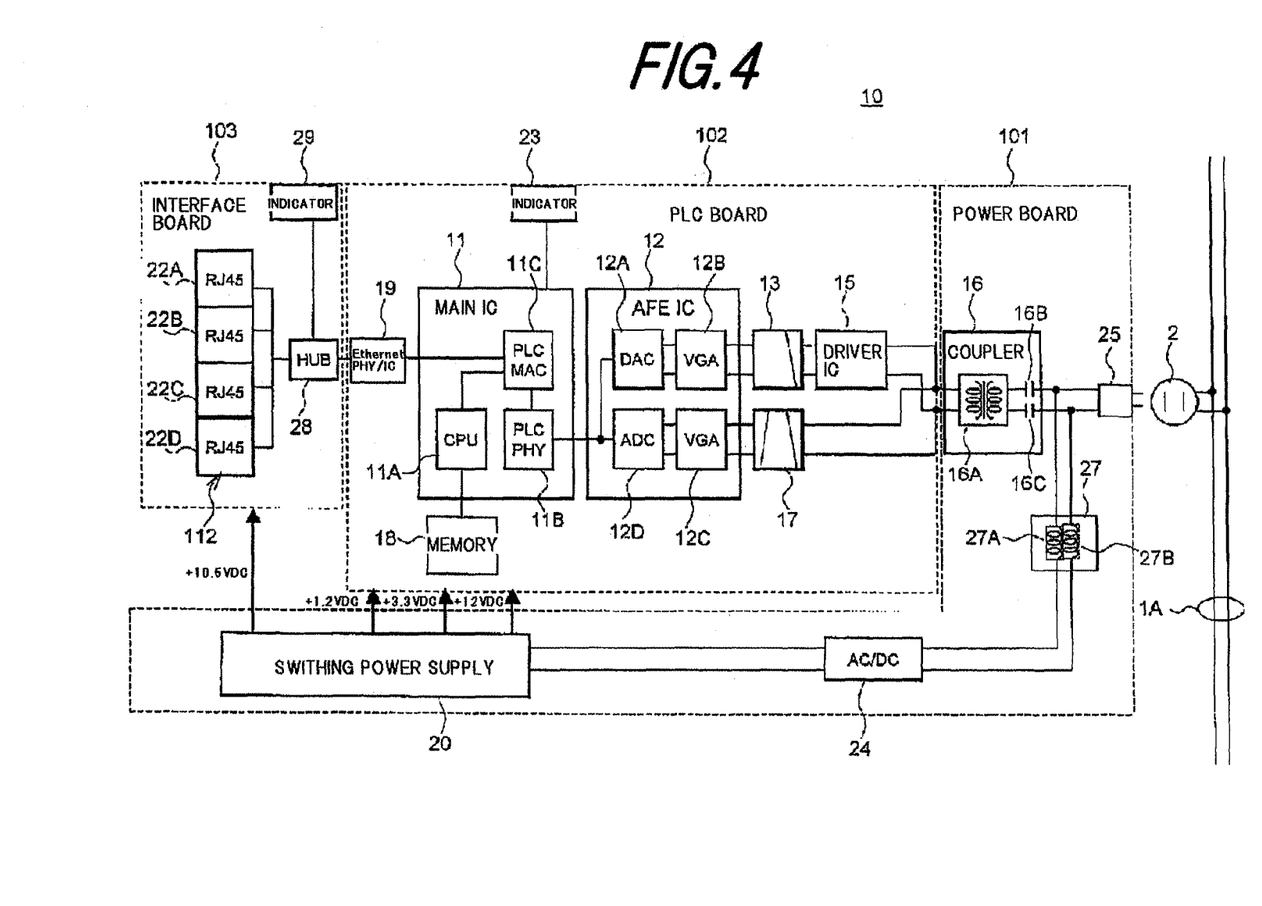
FIG. 4 is block diagram illustrating an example of a circuit configuration of the communication apparatus.

As described above, the PLC modem 10 includes the power board 101, the communication board 102, and the interface board 103. As shown in FIG. 4, the power board 101 is provided with the power plug 25, the coupler 16, an impedance upper 27, an AC/DC converter 24, and switching power supply 20. The switching power supply 20 supplies various direct-current voltages (for example, +1.2 V, +3.3 V, +10.5 V, and +12 V) to the communication board 102 or the interface board 103. The switching power supply 20 includes, for example, a switching transformer and a DC-DC converter (which are all not shown). The electric power is supplied from the power plug 25 to the switching power supply 20 through the impedance upper 27 and AC/DC converter 24. The coupler 16 separates and couples the PLC signal, which is a high frequency signal, from and to the power line and includes the coil transformer 16A and the coupling capacitors 16B and 16C. The coupling capacitors 16B and 16C are connected to the power plug 25, and the coil transformer 16A is connected to the communication board 102.

The communication board 102 is provided with a main IC (Integrated Circuit) 11, an AFE/IC (Analog Front END/ Integrated Circuit) 12, a low-pass filter (LPF) 13, a driver IC 15, and a band-pass filter (BPF) 17, a memory 18, and an Ethernet PHY/IC (Physical layer/Integrated Circuit) 19. An indicator 23 is connected to the main IC 11. The main IC 11 functions as a communication control unit in power line communication.

The main IC 11 includes a CPU (Central Processing Unit) 11A, a PLC/MAC (Power Line Communication/Media Access Control layer) block 11 C, and a PLC/PHY (Power Line Communication/Physical layer) block 11 B. A 32-bit RISC (Reduced Instruction Set Computer) processor is mounted in the CPU 11k The PLC/MAC block 11C manages a MAC layer (Media Access Control layer) of a transmission signal and a reception signal. The PLC/PHY block 11B manages a PHY layer (Physical layer) of a transmission signal and a reception signal. The AFE/IC 12 includes a DA converter (DAC: D/A converter) 12A, an AD converter (ADC: A/D converter) 12D, and variable gain amplifiers (VGA: Variable Gain Amplifier) 12B and 12C. In addition, the CPU 11A controls operations of the PLC/MAC block 11C and the PLC/PHY block 118 using data stored in the memory 18 and also controls the PLC modem 10 as a whole.

The interface board 103 is provided with a hub 28, an indicator 29, and the network connection unit 112 housing four RJ45 type modular jacks 22A, 22B, 22C, and 22D. Network cables for making connection to a PC or like are connected to the modular jacks 22A, 22B, 22C, and 22D.

Communication by means of the PLC modem 10 in FIG. 4 is performed as follows. That is, data input to the modular jacks 22A, 22B, 22C, and 22D is transmitted to the main IC 11 through the hub 28 and the Ethernet PHY/IC 19, and a digital transmission signal is generated by performing a digital signal process. The generated digital transmission signal is converted into an analog signal by the DA converter (DAC) 12A of the AFE/IC 12 and superposed on a transmission path as the PLC signal through the low-pass filter 13, the driver IC 15, and the coupler 16 to be output to a power line 1A through the power plug 25 and an outlet 2.

The signal received from the power line 1A is separated as the PLC signal via the coupler 16, its gain is adjusted by the variable gain amplifier (VGA) 12C of the AFE/IC 12 through the band-pass filter 17, and the signal is converted into a digital signal by the AD converter (ADC) 12D. The converted digital signal is transmitted to the main IC 11 and subjected to a digital signal process to be converted into digital data. The converted digital data is output from the modular jacks 22A, 22B, 22C, and 22D through the Ethernet PHY/IC 19 and the hub 28.

The PLC modem 10 is configured in such a manner that the power board 101 is a separate body from the communication board 102, and thus the communication board 102 is separately provided to be connected to the power board 101 through the connector. In this way, the communication board 102 provided with the signal processor for power line communication can be used in common in various apparatuses. Accordingly, when a power line communication function is provided to various apparatuses, the communication board 102 can be used in common. Therefore, since it is not necessary to design a separate communication board in accordance with the shape of various apparatuses, design cost or manufacture cost can be reduced.

The first connector 105 and the second connector 106 are separately provided in the communication board 102. The first connector 105 is apart from the second connector 106. The coupler 16 is disposed in the vicinity of the first connector 105 and the power board 101, and an input unit (analog signal processor) for the PLC signal formed on the communication board 102 can be connected to the coupler 16 through the first connector 105 at a location where they are as close as possible. Accordingly, it is possible to shorten the transmission path for an analog signal. Moreover, the communication board 102 can come closer to the coupler 16 by configuring the communication board 102 to be erect with respect to the power board 101. Furthermore, since the communication board 102 and the interface board 103 can be connected to each other through the second connector 106 at a location which is away from the first connector 105, a transmission path for a digital signal containing data transmitted to and received from a network connector such as the Ethernet (registered trademark) which is an interface of another apparatus can be apart from the analog signal processor or a transmission path for an analog signal. With such a configuration, interference of noise can be reduced, thereby improving a communication performance.

The power board 101 and the interface board 103 may be configured as two separate boards, and may be also configured as one integrated board like a base board. When the power board 101 and the interface board 103 are configured as the one board, the number of components is reduced. When the power board 101 and the interface board 103 are configured as the two boards, the interface board 103 can be exchanged with a different board having a different shape of the network connection unit 112 or the like. Accordingly, it is possible to configure the PLC modem to easily correspond to the different number of connection ports, various network types, and the like.

The heat radiator 107 is formed by curving a plate-shaped member such as a metal plate having high thermal conductivity and electrical conductivity, and holds the communication board 102 so as to be housed and fixed to the casing. With such a configuration, it is possible to maintain strength while ensuring sufficient heat radiating capacity and heat radiating area. The heat radiator 107 extends so that at least a part thereof face the power board 101 and is provided so as not to overlap with the power plug 25 and the plug receiver 111.

A support portion 107D formed to be erected from the interface board 103 is disposed in the vicinity of an end portion 107C of an extension portion facing the power board 101 of the heat radiator 107. With such a configuration, even though stress is applied to the heat radiator 107 toward the power board 101, the end portion 107C is held by the support portion 107D, so that displacement of the heat radiator 107 toward the power board 101 is regulated. At this time, a space between the heat radiator 107 and the power plug 25 or the plug receiver 111 is sufficiently ensured. As a modified example of the heat radiator 107, the heat radiator 107 may be formed in a substantially reverse U shape with respect to the power board 101 and the interface board 103 so that displacement of the heat radiator toward the power board is suppressed. By configuring the heat radiator 107 in this manner, it is possible to preventing contact with the power plug 25 and the like while having a sufficient heat radiating function.

Hereinafter, other embodiments regarding to arrangement of the power board 101, the communication board 102, and the interface board 103 will be described with reference to FIGS. 5 to 9.

Figure 5:
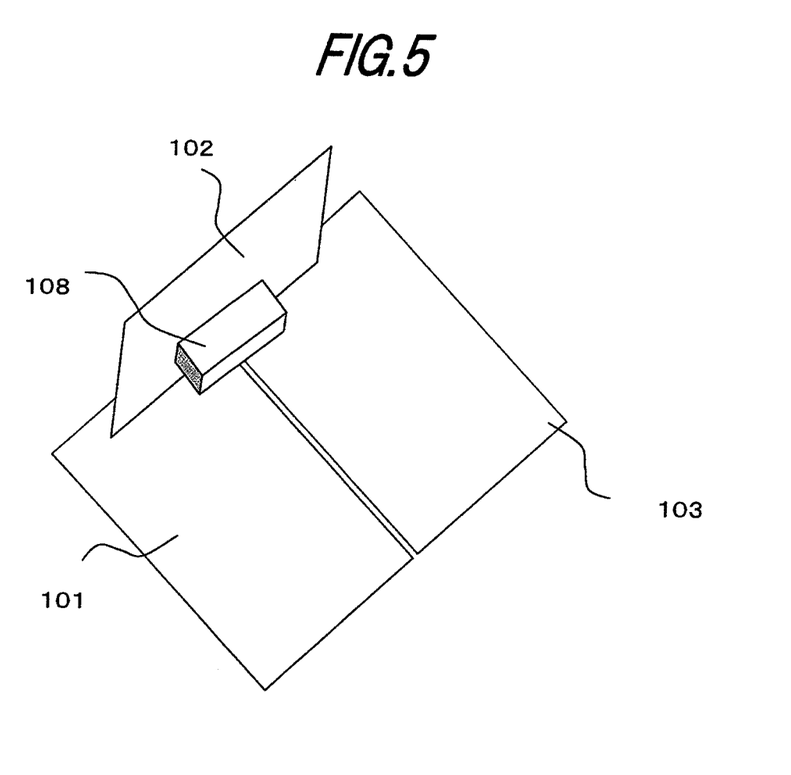
FIG. 5 is a perspective view illustrating an arrangement configuration of the major elements of the communication apparatus.

As shown in FIG. 5, the communication board 102 is disposed so that a direction of a normal line of the communication board 102 is different from a direction of a normal line of the power board 101 and a direction of a normal line of the interface board 103. In addition, the communication board 102, the power board 101, and the interface board 103 are electrically connected to each other. The power board 101 and the interface board 103 are arranged on one plane. In addition, the power board 102 is disposed to be erect at a substantially right angle with respect to the power board 101 and the interface board 103 arranged on one plane.

It is possible to allow the outer size of the upper casing 110 for housing the boards to be small by arranging the power board 101 and the interface board 103 on one plane, thereby downsizing the PLC modem 10. Moreover, it is possible to ensure a sufficient space for mounting electronic components on the power board 101 and the interface board 103, by disposing the power board 102 to be erect at the substantially right angle with respect to the power board 101 and the interface board 103 arranged on one plane. In particular, such a configuration is appropriate in mounting electronic components since many large-sized electronic components (for example, the coil transformer 16A of the coupler 16 or the coupling capacitors 16B and 16C) can be mounted on the power board 101.

In FIG. 5, a longitudinal direction of the communication board 102 is substantially parallel to a transverse direction of the power board 101 and a transverse direction of the interface board 103.

The power board 101, the interface board 103, and the communication board 102 are electrically connected to each other through a connector 108. The connector 108 has functions of the power connector 104, the first connector 105, and the second connector 106 described above.

By allowing the connector 108 to have the functions of the power connector 104, the first connector 105, and the second connector 106, it is possible to reduce the number of components used in the PLC modem 10, thereby simplifying a manufacture process of the PLC modem 10.

However, the PLC signal is much influenced by noise occurring from a digital signal for an interface, since the connector 108 has the functions of the first connector 105 and the second connector 106. For that reason, in the connector 108, it is preferable that an insulating member (not shown) is disposed around the transmission path for transmitting the PLC signal.

It is preferable that the coupler 16 (not shown) is disposed in the vicinity of the connector 108. Since a transmission path for the PLC signal between the coupler 16 and the connector 108 can be shortened by disposing the coupler 16 in the vicinity of the connector 108, it is possible to improve a communication performance of the PLC modem 10.

Figure 6:
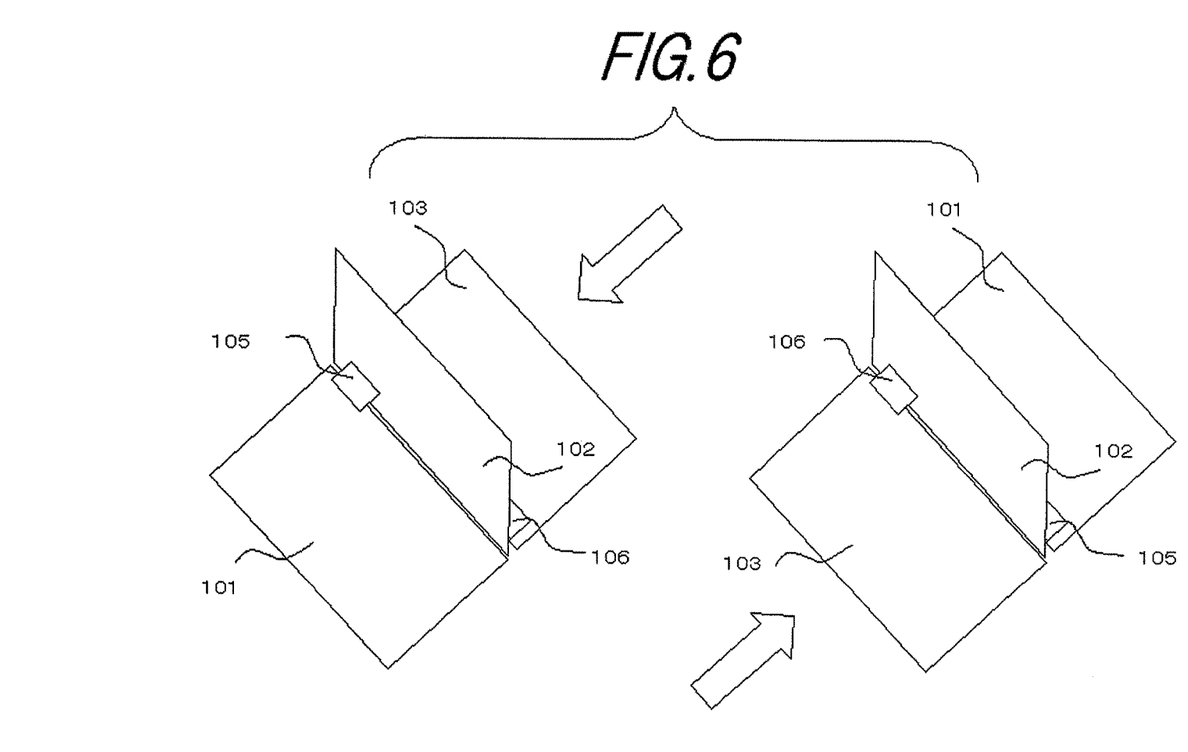
FIG. 6 is a perspective view illustrating an arrangement configuration of the major elements of the communication apparatus.

Like the configuration shown in FIG. 5, a configuration of major components of the PLC modem 10 shown in FIG. 6 is as follows. That is, a direction of a normal line of the communication board 102 is different from a direction of a normal line of the power board 101 and a direction of a normal line of the interface board 103. In addition, the communication board 102, the power board 101, and the interface board 103 are electrically connected to each other.

The power board 101 and the interface board 103 are arranged on one plane. In addition, the power board 102 is disposed to be erect at a substantially right angle with respect to the power board 101 and the interface board 103 arranged on one plane, and is disposed between the power board 101 and the interface board 103.

In the configuration example shown in FIG. 6, since the communication board 102 is disposed between the power board 101 and the interface board 103, an area where the communication board 102 overlaps with the power board 101 and the interface board 103 can be made small. Accordingly, such a configuration is appropriate in mounting electronic components since a large area where electronic components are mounted in the power board 101 and the interface board 103 and the interface board 103 can be ensured.

Moreover, like the configuration example shown in FIG. 5, since the power board 102 is disposed to be erect at the substantially right angle with respect to the power board 101 and the interface board 103 arranged on one plane, a large area where electronic components are mounted in the power board 101 and the interface board 103 can be ensured. In particular, such a configuration is appropriate in mounting electronic components since many large-sized electronic components (for example, the coil transformer 16A of the coupler 16 or the coupling capacitors 16B and 16C) can be mounted on the power board 101.

In FIG. 6, a longitudinal direction of the communication board 102 is substantially parallel to a longitudinal direction of the power board 101 and a longitudinal direction of the interface board 103.

The first connector 105 is provided on one main surface of the communication board 102 and the second connector 106 is provided on the other main surface thereof. The first connector 105 and the second connector 106 can be located at any location of the communication board 102, but it is preferable that the first connector 105 and the second connector 106 is disposed so as to be spaced from each other. Since an influence of noise occurring from the digital signal of an interface for receiving the PLC signal can be reduced by spacing the first connector 105 and the second connector 106, it is possible to improve a communication performance of the PLC modem 10. In case where the first connector 105 and the second connector 106 cannot be arranged to be separated from each other, an insulating member (not shown) may be provided at any location of the communication board 102.

In FIG. 6, electrical power is supplied from the power board 101 to the interface board 103 through the first connector 105 and the second connector 106.

In addition, it is preferable that the coupler 16 (not shown) is disposed in the vicinity of the first connector 105. Since a transmission path for the PLC signal between the coupler 16 and the first connector 105 can be shortened by disposing the coupler 16 in the vicinity of the first connector 105, it is possible to improve a communication performance of the PLC modem 10.

Figure 7:
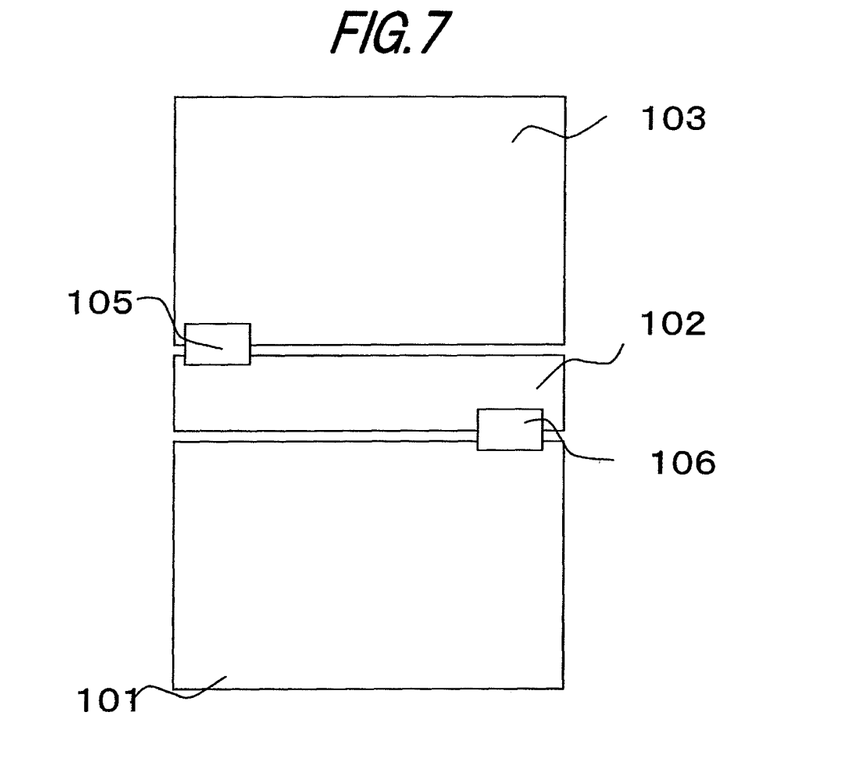
FIG. 7 is a perspective view illustrating an arrangement configuration of the major elements of the communication apparatus.

In FIG. 7, the communication board 102, the power board 101, and the interface board 103 are arranged so that a direction of a normal line of the communication board 102, a direction of a normal line of the power board 101, and a direction of a normal line of the interface board 103 are substantially parallel to each other. That is, the communication board 102, the power board 101, and the interface board 103 are arranged on substantially one plane.

Since an outer size (size in the direction of the normal lines of the communication board 102, the power board 101, and the interface board 103) of the upper casing 110 can be made small by arranging all the boards on substantially one plane, such a configuration is appropriate in allowing the PLC modem 10 to be thin.

Since the electronic components mounted on the boards can be prevented from interfering one another by arranging all the boards on substantially one plane even in a case of applying a stress to the PLC modem 10, it is possible to improve durability or safety of the PLC modem 10.

In the configuration example shown in FIG. 7, since the communication board 102 is arranged between the power board 101 and the interface board 103, an area where the communication board 102 overlaps with the power board 101 and the interface board 103 can be made equal to the area shown in FIG. 6. Accordingly, since a large area where electronic components are mounted on the power board 101 and the interface board 103 can be ensured, such a configuration is appropriate in mounting the electronic components.

In FIG. 7, a longitudinal direction of the communication board 102 is substantially parallel to a longitudinal direction of the power board 101 and a longitudinal direction of the interface board 103.

The first connector 105 is provided on one long side of the communication board 102 and the second connector 106 is provided on the other long side thereof.

The first connector 105 and the second connector 106 can be provided at any location, but it is preferable that the first connector 105 and the second connector 106 are provided to be apart from each other. Since the PLC signal and a digital signal for an interface can be separated one another by spacing the first connector 105 and the second connector 106 from each other, it is possible to reduce a noise influence of the digital signal on the PLC signal.

In FIG. 7, electric power is also supplied from the power board 101 to the interface board 103 through the first connector 105 and the second connector 106, like the configuration example shown in FIG. 6.

It is preferable that the coupler 16 (not shown) is disposed in the vicinity of the first connector 105. Since a transmission path for the PLC signal between the coupler 16 and the first connector 105 can be shortened by disposing the coupler 16 in the vicinity of the first connector 105, it is possible to improve the communication performance of the PLC modem 10.

Figure 8:
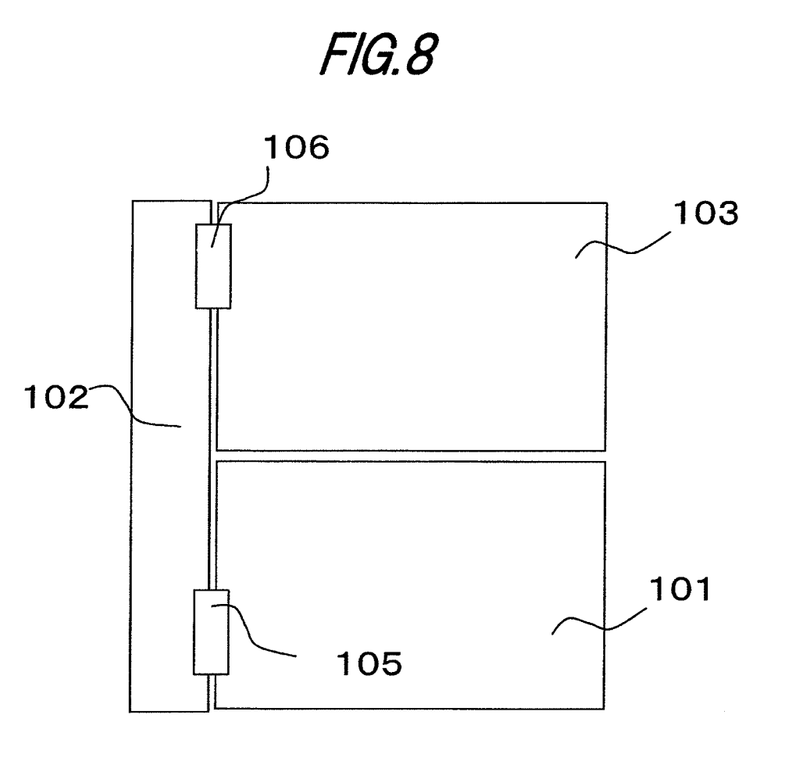
FIG. 8 is a perspective view illustrating an arrangement configuration of the major elements of the communication apparatus.

In a configuration example shown in FIG. 8, the communication board 102, the power board 101, and the interface board 103 are arranged so that a direction of a normal line of the communication board 102, a direction of a normal line of the power board 101, and a direction of a normal line of the interface board 103 are substantially parallel to each other, like the configuration example shown in FIG. 7. That is, the communication board 102, the power board 101, and the interface board 103 are arranged on substantially one plane.

As shown in FIG. 8, a longitudinal direction of the communication board 102 is substantially perpendicular to a longitudinal direction of the power board 101 and a longitudinal direction of the interface board 103.

Since an outer size (size in the direction of the normal lines of the communication board 102 and the like) of the upper casing 110 can be made small by arranging all the boards on substantially one plane, such a configuration is appropriate in allowing the PLC modem 10 to be thin.

Since the electronic components mounted on the boards can be prevented from interfering one another by arranging all the boards on substantially one plane even in a case of applying a stress to the PLC modem 10, it is possible to improve durability or safety of the PLC modem 10.

The first connector 105 and the second connector 106 are provided on one long side of the communication board 102.

The first connector 105 and the second connector 106 can be provided at any location of the one long side of the communication board 102, but it is preferable that the first connector 105 is apart from the second connector 106. Since the PLC signal and a digital signal for an interface can be separated one another by spacing the first connector 105 and the second connector 106 from each other, it is possible to reduce a noise influence of the digital signal on the PLC signal.

It is preferable that the coupler 16 (not shown) is disposed in the vicinity of the first connector 105. Since a transmission path for the PLC signal between the coupler 16 and the first connector 105 can be shortened by disposing the coupler 16 in the vicinity of the first connector 105, it is possible to improve the communication performance of the PLC modem 10.

Like the configuration example shown in FIG. 5, the communication board 102, the power board 101, and the interface board 103 may be connected to each other through the connector 108.

It is preferable that the coupler 16 (not shown) is disposed in the vicinity of the first connector 105. Since a transmission path for the PLC signal between the coupler 16 and the first connector 105 can be shortened by disposing the coupler 16 in the vicinity of the first connector 105, it is possible to improve the communication performance of the PLC modem 10.

Figure 9:
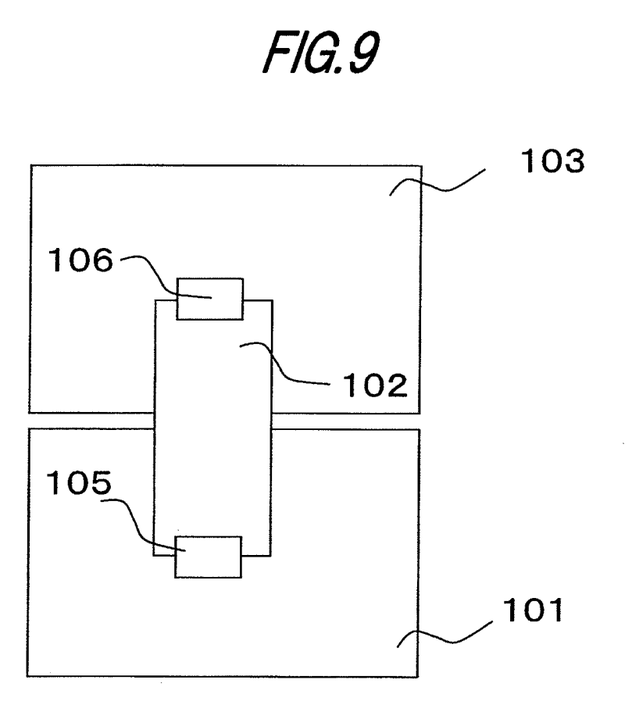
FIG. 9 is a perspective view illustrating an arrangement configuration of the major elements of the communication apparatus.

In a configuration example shown in FIG. 9, the communication board 102, the power board 101, and the interface board 103 are arranged so that a direction of a normal line of the communication board 102, a direction of a normal line of the power board 101, and a direction of a normal line of the interface board 103 are substantially parallel to each other, and the communication board 102 overlaps with the power board 101 and the interface board 103.

Since outer size of the upper casing 110 and the lower casing 100 can be made small by overlapping the communication board 102 with the power board 101 and the interface board 103, such a configuration is advantageous in miniaturization of the PLC modem 10.

The first connector 105 and the second connector 106 can be provided at any location of the edge of the communication board 102, but it is preferable that the first connector 105 and the second connector 106 are provided on a short side of the communication board 102 like the configuration example shown in FIG. 9. With such a configuration, since the first connector 105 can be disposed apart from the second connector 106, it is possible to reduce a noise influence of a digital signal for an interface on the PLC signal.

Electric power is supplied from the power board 101 to the interface board 103 through the first connector 105 and the second connector 106.

Since description regarding to components mounted on the power board 101, the communication board 102, and the interface board 103 in FIGS. 5 to 9 is the same as that in FIGS. 1 to 4, the repetitive description is omitted.

It is preferable that the coupler 16 (not shown) is disposed in the vicinity of the first connector 105. Since a transmission path for the PLC signal between the coupler 16 and the first connector 105 can be shortened by disposing the coupler 16 in the vicinity of the first connector 105, it is possible to improve the communication performance of the PLC modem 10.

Specifically, the vicinity of the first connector 105 refers to a range of a 2 cm radius from the first connector 105 in the description of the coupler 16.

In this way, the communication board 102 can be configured so as to be used in common in other apparatuses. With such a configuration, it is possible to improve the communication performance by shortening the transmission path of an analog signal, since the analog signal processor of the communication board 102 can be disposed in the vicinity of the coupler 16. Moreover, it is possible to improve the communication performance by reducing the noise interference, since the analog signal processor provided on the communication board 102 and the network interface unit provided on the interface board 103 can be separated from each other. Furthermore, it is possible to prevent the heat radiator 107 from coming in contact with the input unit of the power line such as the power plug 25 and the plug receiver 111 while ensuring a sufficient heat releasing function of the heat radiator 107.

As for the interface unit, an interface for wireless communication or an interface for a coaxial cable may be used.

The invention is not limited to the above-described embodiments, but may be modified and applied in various forms by a person skilled in the art without departing the specification and on the basis of known techniques. Therefore, it can be understood that the various forms are included in the range of the invention.

We claim:
1. A power line communication apparatus, comprising:
a power plug configured to connect to a power line;
a power plug receiver configured to connect to the power plug;
a power line communicator configured to receive a signal transmitted through the power line;
a power supplier configured to generate power based on power received from the power plug and supply the generated power to the power line communication apparatus;
a power board on which the power plug receiver is mounted; and
a heat radiator that connects to the power line communicator and radiates heat generated from the power line communicator,
wherein a portion of the heat radiator overlaps a portion of the power board when viewed perpendicular to the power board,
wherein the portion of the power board that is overlapped by the heat radiator when view perpendicular to the power board does not include the power plug receiver, and
wherein the plug receiver is located on a side of the power board that is not overlapped by the heat radiator when viewed perpendicular to the power board, the plug receiver being separated from the heat radiator by a space region.

2. The power line communication apparatus according to claim 1,
wherein the portion of the heat radiator is substantially parallel to the power board.

3. The power line communication apparatus according to claim 1, further comprising:
a casing that houses the power line communicator, the power board, and all of the heat radiator.

4. The power line communication apparatus according to claim 1,
wherein the power line communicator includes a power line communication board and a processor mounted on the power line communication board.

5. The power line communication apparatus according to claim 4,
wherein at least a portion of the power line communication board overlaps the power board when viewed perpendicular to the power board.

6. The power line communication apparatus according to claim 5,
wherein the portion of the power line communication board is substantially parallel to the power board.

7. The power line communication apparatus according to claim 1, further comprising:
a board connector that connects electricity the power board to the power line communication board and includes a transmission path for the signal,
wherein the power line communicator receives the signal transmitted through at least the power plug and the transmission path.

8. The power line communication apparatus according to claim 1, further comprising:
a casing; and
an interface connector to which a communication cable, different from the power line, is inserted,
wherein the interface connector is exposed on the outside of the casing.

9. The power line communication apparatus according to claim 8,
wherein an insertion direction of the communication cable into the interface connector is substantially parallel to the power board.

10. The power line communication apparatus according to claim 8,
wherein the interface connector is disposed on a same plane as the power board.

11. The power line communication apparatus according to claim 9,
wherein the insertion direction is between the power board and the portion of the heat radiator.

12. A power line communication apparatus, comprising:
a power plug configured to connect to a power line;
a power plug receiver configured to connect to the power plug;
a power line communicator configured to receive a signal transmitted through the power line;
a power supplier configured to generate power based on power received from the power plug and supply the generated power to the power line communication apparatus;
a heat radiator that connects to the power line communicator and radiates heat generated from the power line communicator; and
a power board that includes a first portion on which the power plug receiver is mounted and a second portion overlaps a portion of the heat radiator when viewed perpendicular to the power board,
wherein the second portion of the power board that is overlapped by a portion of the heat radiator when view perpendicular to the power board does not include the power plug receiver, and
wherein the plug receiver is located on a side of the power board that is not overlapped by the heat radiator when viewed perpendicular to the power board, the plug receiver being separated from the heat radiator by a space region.

13. The power line communication apparatus according to claim 12,
wherein the first portion of the power board does not overlap the heat radiator when viewed perpendicular to the power board.

14. The power line communication apparatus according to claim 12,
wherein the power line communicator includes a power line communication board and a processor mounted on the power line communication board,
wherein at least a portion of the power line communication board overlaps the power board the when viewed perpendicular to the power board.

15. The power line communication apparatus according to claim 14,
wherein the portion of the power line communication board is substantially parallel to the power board.

16. The power line communication apparatus according to claim 14, further comprising:
an interface connector that connects to a communication cable over which a digital signal is transmitted,
wherein the second portion of the power board is located at between the first portion of the power board and the interface connector.

17. A power line communication apparatus, comprising:
a power plug configured to connect to a power line;
a power plug receiver configured to connect to the power plug;
a power line communicator configured to receive a signal transmitted through the power line;
a power supplier configured to generate power based on power received from the power plug and supply the generated power to the power line communicator;
a power board on which the power plug receiver is mounted; and
a heat radiator that connects to the power line communicator and radiates heat generated from the power line communicator,
wherein the heat radiator includes a heat radiating portion that is parallel to the power board and is positioned so that a heat radiating portion does not overlap the power plug receiver when viewed perpendicular to the power board, and
wherein the power plug receiver is located on a side of the power board that is not overlapped by the heat radiator when viewed perpendicular to the power board, the plug receiver being separated from the heat radiator by a space region.

18. The power line communication apparatus according to claim 17,
wherein the heat radiating portion of the heat radiator overlaps a portion of the power board that does not include the power plug receiver.

19. The power line communication apparatus according to claim 18,
wherein the power line communicator includes a power line communication board and a processor mounted on the power line communication board, and
at least a portion of the power line communication board overlaps the power board the when viewed perpendicular to the power board.

20. The power line communication apparatus according to claim 17, further comprising:
a casing that houses the power line communicator, the power board and all of the heat radiator.

* * * * *